(12) United States Patent
Assefa et al.

(10) Patent No.: US 7,248,615 B2
(45) Date of Patent: Jul. 24, 2007

(54) ELECTRICALLY-ACTIVATED PHOTONIC CRYSTAL MICROCAVITY LASER

(75) Inventors: Solomon Assefa, Cambridge, MA (US); Leslie A. Kolodziekski, Belmont, MA (US); Gale S. Petrich, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 273 days.

(21) Appl. No.: 10/721,841

(22) Filed: Nov. 25, 2003

(65) Prior Publication Data

US 2005/0111511 A1 May 26, 2005

(51) Int. Cl.
*H01S 3/08* (2006.01)
(52) U.S. Cl. .......................................... 372/92; 372/97
(58) Field of Classification Search ................. 372/92, 372/97
See application file for complete search history.

(56) References Cited

U.S. PATENT DOCUMENTS

| | | | | |
|---|---|---|---|---|
| 5,682,401 A | | 10/1997 | Joannopoulos et al. | |
| 6,058,127 A | * | 5/2000 | Joannopoulos et al. | 372/92 |
| 6,198,860 B1 | * | 3/2001 | Johnson et al. | 385/28 |
| 6,711,200 B1 | * | 3/2004 | Scherer et al. | 372/64 |
| 2003/0043870 A1 | | 3/2003 | Shchukin et al. | |

FOREIGN PATENT DOCUMENTS

WO  WO 02/056430 A2  7/2002

OTHER PUBLICATIONS

Happ, Thomas D. et al., "Two-dimensional photonic crystal coupled-defect laser diode," Applied Physics Letters, American Institute of Physics 2003, New York, vol. 82 No. 1, Jan. 6, 2003, pp. 4-6.
Inoshita, K. et al., "Room-Temperature Lasing Characteristics of Bend and Branch in Photonic Crystal Waveguide," Japanese Journal of Applied Physics, Tolyo, JP, vol. 42 No. 11, Part 1, Nov. 10, 2003, pp. 6887-6891.

* cited by examiner

*Primary Examiner*—Dung T. Nguyen
(74) *Attorney, Agent, or Firm*—Gauthier & Connors LLP

(57) ABSTRACT

A microcavity structure includes a first waveguide that includes a first photonic crystal microcavity. A second waveguide includes a second photonic crystal microcavity. A microcavity active region is created by overlapping the first and second microcavities.

48 Claims, 3 Drawing Sheets

ELECTRICALLY-ACTIVATED PHOTONIC CRYSTAL MICROCAVITY LASER

This invention was made with government support under Grant Number DMR-9808941, awarded by NSF. The government has certain rights in the invention.

BACKGROUND OF THE INVENTION

The invention relates to the field of photonic crystals, and in particular to electrically activated photonic crystal microcavity lasers.

Photonic crystals (PCs) have become increasingly important for applications in integrated photonic circuits. Many suggestions have been made on how to use PCs in directional couplers, waveguides, and LEDs. Furthermore, investigations have been done on two-dimensional (2D) photonic crystal lasers with photo-pumped cavities. However, the optical pumping methods currently employed for photonic crystal lasers are inefficient, and they make it difficult to integrate the lasers with other optoelectronic devices on the same chip. As a result, the photonic crystal lasers have not been as useful as electrically activated edge emitting lasers and vertical cavity surface emitting lasers (VCSELs). This invention addresses the creation of electrically activated photonic crystal lasers.

SUMMARY OF THE INVENTION

According to one aspect of the invention, there is provided a microcavity structure. The microcavity structure includes two or more microcavity waveguides. One or more microcavity active regions are created by the overlap of the microcavity waveguides.

According to another aspect of the invention, there is provided a method of forming a microcavity structure. The method includes providing two or more microcavity waveguides. Also, the method includes forming one or more microcavity active regions by overlapping the microcavity waveguides.

According to another aspect of the invention, there is provided a microcavity structure. The microcavity structure includes a first waveguide that includes a first photonic crystal microcavity. A second waveguide includes a second photonic crystal microcavity. A microcavity active region is created by overlapping the first and second microcavities.

According to another aspect of the invention, there is provided a method of forming a microcavity structure. The method includes forming a first waveguide including a first photonic crystal microcavity. Also, the method includes forming a second waveguide including a second photonic crystal microcavity. A microcavity active region is created by overlapping said first layer and second microcavities.

DETAILED DESCRIPTION OF THE INTENTION

Figure 1:
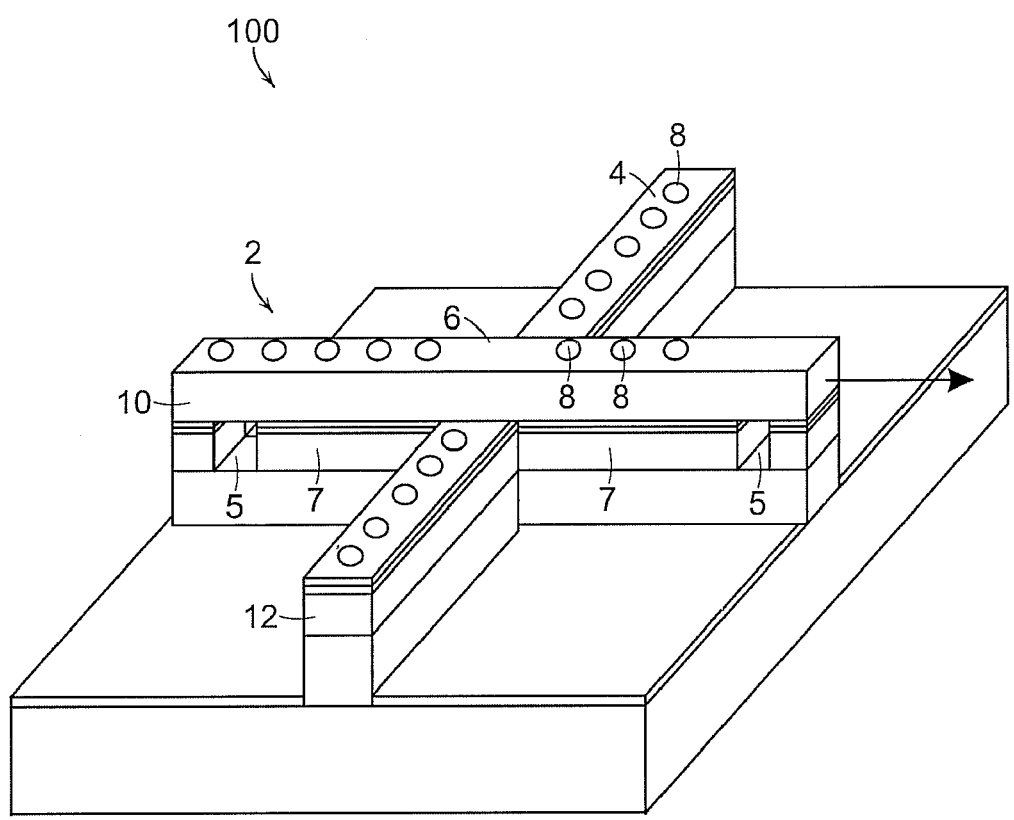
FIG. 1 is a schematic block diagram of a photonic crystal microcavity laser in accordance with the invention.

FIG. 1 is a schematic block diagram of an electrically-activated photonic crystal microcavity laser 100 in accordance with the invention. The laser uses waveguides 2, 4 that are formed on two different layers 10, 12, where the first layer 10 has a different index of refraction than that of the second layer 12. The waveguides 2,4 are patterned in both layers 10,12 in such a way that the waveguide 2 of one layer 10 is rotated from the waveguide 4 of the other layer 12, hence crossing at an angle, as shown in FIG. 1. As a result, the two waveguides overlap at an angle only in a small region 6. Outside of this overlap region 6, the two waveguides 2, 4 are patterned with one dimensional (1D) photonic crystals composed of an appropriate number of holes 8 that have a specified diameter. This one dimensional (1D) photonic crystal forms a band gap where photons of certain frequencies are not allowed to propagate depending on the period and the fill-factor of the holes. Note that the photonic crystals act as optical reflectors. Furthermore, other types of optical reflectors can be used in place of the photonic crystals implemented in this embodiment.

The presence of the unpatterned overlap region 6, which breaks the periodicity of both 1D photonic crystal waveguides, introduces a photonic crystal defect where one or more modes reside inside the photonic band gap. Stated differently, the photonic crystals on each side act as perfect mirrors, hence the photonic crystal defect acts as a high Q optical microcavity resonator. By designing the defect length appropriately, the emission wavelength can be controlled.

One of the waveguides 4 contains an active material, which is used for the generation of photons; the other waveguide 2 is used as a guiding waveguide that directs the light out of the defect region. The active material can be quantum wells or quantum dots emitting at the desired wavelength. For example, in an exemplary embodiment, as shown in FIG. 1, the laser could have the lasing waveguide 4 below and the guiding waveguide 2 on top crossing at an angle. In this case, the active material could be near the top of the lower waveguide 4, hence close to the upper guiding waveguide 2. The upper waveguide 2 can have a higher effective index of refraction than the lower waveguide 4, and the lower waveguide 4 will have a larger band gap than the active material.

Figure 2:
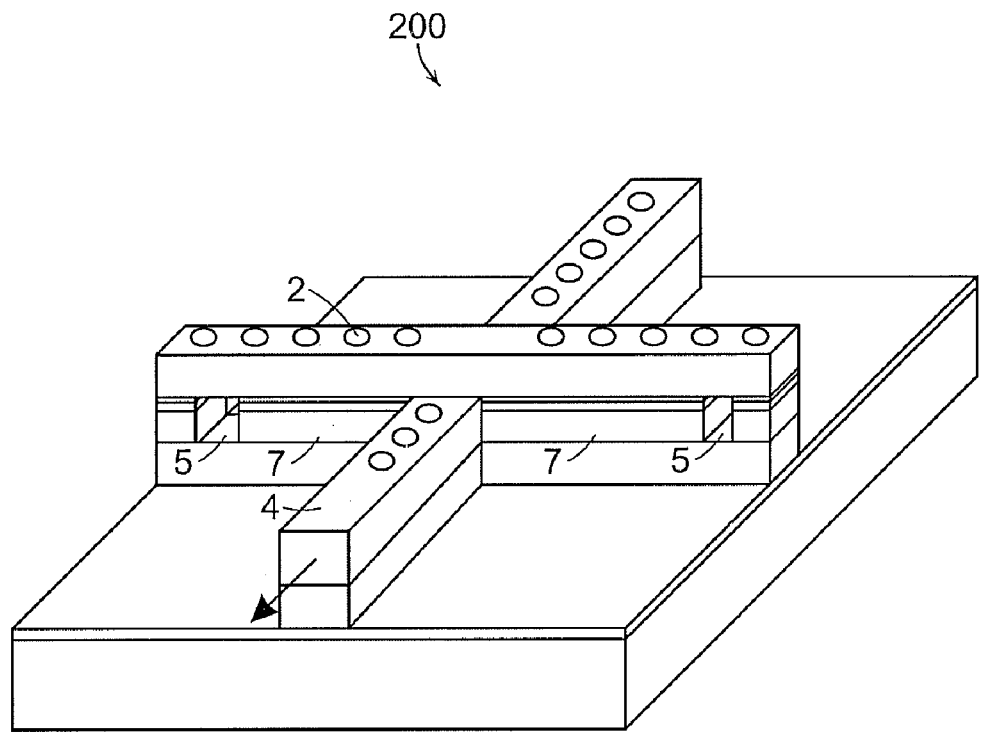
FIG. 2 is a schematic block diagram of a second embodiment of the electrically-activated photonic crystal microcavity laser.

Another exemplary embodiment of an electrically-activated photonic crystal microcavity 200, shown in FIG. 2, can have the active material in the top waveguide 2 and use the lower waveguide 4 for guiding. As shown in these examples, the angle of crossing, the height, width, and length of the waveguides and the position of the quantum well can be chosen to achieve the desired effect.

The two waveguides 2, 4 are coupled and the optical mode that emanates from the active material extends across both waveguides at their intersection. The hole number, size, and periodicity, as well as the waveguide width and height can be controlled as desired. As a result, reflectivity of the photonic crystal mirrors can be controlled by constructing the photonic band gap in the appropriate manner. Furthermore, if the defect region is designed to act as a high Q microcavity, the modal gain can be enhanced due to the increase in the mode overlap with the active region before leaking into the guiding waveguide.

Figure 3A:
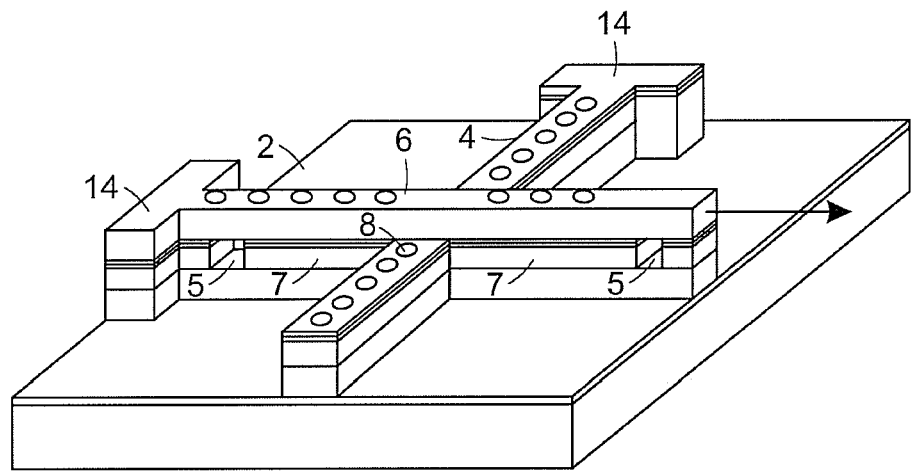
FIG. 3 is a schematic block diagram of a third embodiment of the electrically-activated photonic crystal microcavity laser.
Figure 3B:
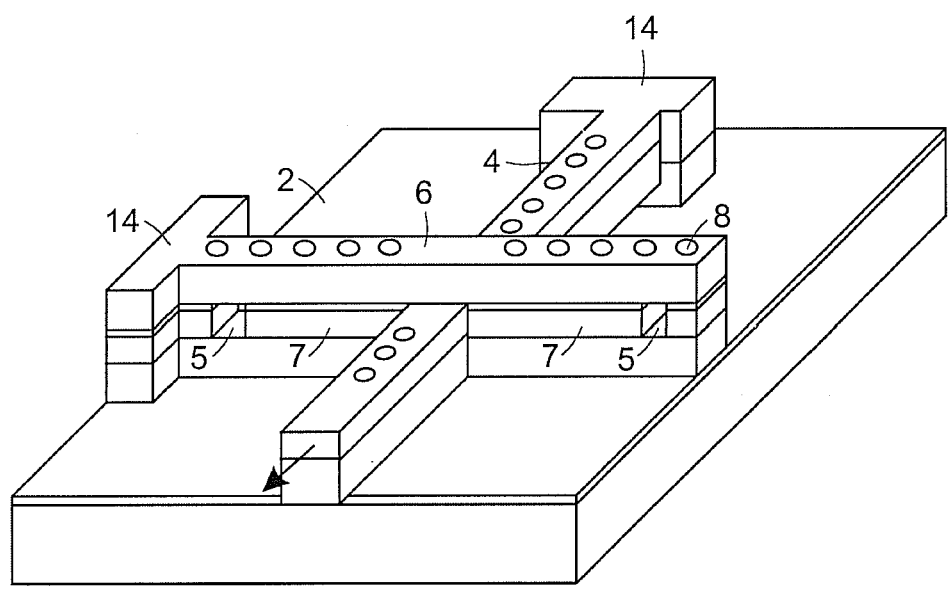

Each waveguide 2, 4 is doped differently and is connected to contact pads 14 for applying a bias voltage, as shown in FIG. 3A and FIG. 3B. For example, the top waveguide 2 can be n-doped while the bottom waveguide is p-doped, as shown in FIG. 3A. This order can be reversed and the top waveguide can be p-doped while the bottom waveguide is n-doped. The embodiment shown in FIG. 3B can also be doped in the same manner. This results in population inversion and recombination of carriers in the active material in the photonic crystal defect region. Hence, light is generated at the intersection of the two waveguides 2, 4.

The waveguide with the active material will have a larger number of holes to highly confine the generated photons in the overlap region, as shown in FIGS. 3A and 3B. The light leaks into the waveguide 4 of the second layer 12, which will have more holes 8 on one side than the other side. This configuration forces the light to be emitted through the side with the smaller number of holes 8. For example, the light can be directed to the right as shown in FIG. 1. By adjusting the number of holes 8 and the placement of the active material, the light can be directed in any of the four directions.

Current confinement is achieved by converting portion of the material underneath the upper waveguide into an insulator; this can be achieved by forming an undercut 5 or forming an insulator layer 7. By confining the carriers in a smaller active volume in the defect region where the lasing happens, the required threshold current is reduced. Extraction efficiency is improved as a result of the low absorption loss, which is achieved by transferring and confining the generated photons to a waveguide made of a larger band gap, hence low loss, material that does not contain any absorbing active material. The design provides flexibility in controlling the reflectivity and the cavity length, which translates to good control of the external power efficiency. Furthermore, the microcavity increases the modal gain. The threshold current will be small because the small length results in a small active volume.

The inventive design is unique because it has a novel approach for electrically activate photonic crystal microcavity lasers. It solves the problem that has been encountered previously, such as the damage of the quantum well region, because the active region is protected by the two waveguides 2, 4. The doped waveguides 2, 4 are used to transport the carriers to the active region; though holes 8 are etched in the waveguide, there is still a continuous path for current. The small active volume results in low threshold current and the microcavity allows larger modal gain. The other unique aspect of this invention is the use of photonic crystals and crossed waveguides to separate the lasing and guiding processes. Even though free carrier absorption loss still exists, the absorption is reduced through the redirection of the light into a second waveguide that has a lower absorption coefficient and does not contain any absorbing active material. Moreover, the size and period of the photonic crystal holes control the emission wavelength.

The inventive concept is the electrical activation of a microcavity laser by using two overlapping waveguides, on different layers, each patterned with one-dimensional photonic crystals. Each waveguide is doped differently, and it has material continuity that will provide a pathway for carriers to the active region when a bias is applied. The photonic crystal also provides mode confinement in the active region and causes the generated light to be redirected and coupled into the guiding waveguide. This design results in low threshold current and flexibility in controlling the reflectivity, the emission wavelength, as well as the length of the active region. The laser will be very useful in integrated optical chips.

Although the present invention has been shown and described with respect to several preferred embodiments thereof, various changes, omissions and additions to the form and detail thereof, may be made therein, without departing from the spirit and scope of the invention.

What is claimed is:

1. A microcavity structure comprising two or more microcavity waveguides comprising photonic crystal structures, wherein one or more microcavity active regions are created by the overlap of said microcavity waveguides and said two or more microcavity waveguides comprise means for electrical activation and at least one contact pad that is coupled to each of the microcavity waveguides so as to apply voltage across said microcavity structures, wherein a top waveguide comprises p-doped or n-doped material and a bottom waveguide comprises n-doped or p-doped material.

2. The microcavity structure of claim 1, wherein said microcavity overlap is defined by crossing of at least two of the said microcavity waveguide at an angle.

3. The microcavity structure of claim 1, wherein each waveguide includes at least two optical reflectors.

4. The microcavity structure of claim 3 wherein the optical reflector component changes the direction of the incident optical energy.

5. The microcavity structure of claim 4 wherein the optical reflector could be, but is not restricted to, a structure with a periodic change in the refractive index such as a photonic crystal.

6. The microcavity structure of claim 3, wherein the optical reflectors surround the active microcavity regions.

7. The microcavity structure of claim 3, wherein one or more of the optical reflectors define one or more output paths of the generated light.

8. A microcavity structure of claim 1, wherein the microcavity waveguides provide means for material continuity to achieve the conduction of current to the active microcavity overlap regions.

9. The microcavity structure of claim 1 further comprising a mechanism to provide carrier confinement in the active overlap regions by converting the material under portion of the upper waveguide into an insulator.

10. The microcavity structure of claim 1, wherein at least one of the microcavity waveguides comprises active material used in the generation of photons.

11. A microcavity structure in claim 1, wherein the active material is composed of quantum wells and/or quantum dots.

12. The microcavity structure of claim 1, wherein at least one of said microcavity waveguides is used to guide light.

13. A method of forming a microcavity structure comprising:
   providing two or more microcavity waveguides comprising photonic crystal structures;
   forming one or more microcavity active regions by overlapping said microcavity waveguides and said two or more microcavity waveguides comprise means for electrical activation; and
   providing at least one contact pad that is coupled to each of the microcavity waveguides so as to apply voltage across said microcavity structures, wherein a top waveguide comprises p-doped or n-doped material and a bottom waveguide comprises n-doped or p-doped material.

14. The method of claim 13, wherein said microcavity overlap is defined by crossing of at least two of the said microcavity waveguide at an angle.

15. The method of claim 13, wherein each waveguide includes at least two optical reflectors.

16. The method of claim 15, wherein the optical reflector component changes the direction of the incident optical energy.

17. The method of claim 16, wherein the optical reflector could be, but is not restricted to, a structure with a periodic change in the refractive index such as a photonic crystal.

18. The method of claim 15, wherein the optical reflectors surrounds the active microcavity regions.

19. The method of claim 15, wherein one or more of the optical reflectors define one or more output path of the generated light.

20. A method of claim 13, wherein the microcavity waveguides provide means for material continuity to achieve the conduction of current to the active microcavity overlap regions.

21. The method of claim 13 further comprising providing a mechanism to provide carrier confinement in the active regions by converting the material under portion of the upper waveguide into an insulator.

22. The microcavity structure of claim 13, wherein at least one of said first and second waveguides comprises active material used in the generation of photons.

23. A microcavity structure in claim 13, wherein the active material is composed of quantum wells and/or quantum dots.

24. The microcavity structure of claim 13, wherein at least one of said first and second waveguides is used to guide light.

25. A microcavity structure comprising:
   a first waveguide including a first photonic crystal microcavity comprising a first photonic crystal structure having p-doped or n-doped material; and
   a second waveguide including a second photonic crystal microcavity comprising a second photonic crystal structure having n-doped or p-doped material;
   a microcavity active region that is created by overlapping said first and second microcavities; and
   at least one contact pad that is coupled to said first waveguide and at least one contact pad that is coupled to said second waveguide so as to apply voltage across said microcavity structure;
   wherein said first waveguide and second waveguide comprise means for electrical activation.

26. The microcavity of claim 25, wherein the photonic crystal surrounds the active microcavity region.

27. The microcavity structure of claim 25, wherein one or more of the photonic crystals define a single or multiple output path of the generated light.

28. The microcavity structure of claim 25, wherein the first and second waveguides provide means for material continuity to achieve the conduction of current to the active microcavity overlap region.

29. The microcavity structure of claim 25 further comprising a mechanism to provide carrier confinement to the active region by converting the material under portion of the upper waveguide into an insulator.

30. The microcavity structure of claim 25, wherein at least one of said first and second waveguides is used to guide light.

31. The microcavity structure of claim 25, wherein at least one of said first and second waveguides comprises active material used in the generation of photons.

32. The microcavity structure of claim 31, wherein said active material comprises quantum wells and/or quantum dots.

33. The microcavity structure of claim 30, wherein said first waveguide guides generated light and said second waveguide comprises active material used in the generation of photons.

34. The microcavity structure of claim 33, wherein said active material comprises quantum wells and/or quantum dots.

35. The microcavity structure of claim 30, wherein said second waveguide guides generated light and said first waveguide comprises active material used in the generation of photons.

36. The microcavity structure of claim 35, wherein said active material comprises quantum wells and/or quantum dots.

37. A method of forming a microcavity structure comprising:
   forming a first waveguide including a first photonic crystal microcavity having p-doped or n-doped material;
   forming a second waveguide including a second photonic crystal microcavity having n-doped or p-doped material;
   forming a microcavity active region that is created by overlapping said first layer and second microcavities, wherein said first waveguide and second waveguide comprise means for electrical activation; and
   providing at least one contact pad that is coupled to said first waveguide and at least one contact pad that is coupled to said second waveguide so as to apply voltage across said microcavity structure.

38. The method of claim 37, wherein the photonic crystal surrounds the active microcavity region.

39. The method of claim 37, wherein one or more of the photonic crystals define a single or multiple output path of the generated light.

40. The method of claim 37, wherein the first and second waveguides provide means for material continuity to achieve the conduction of current to the active microcavity overlap region.

41. The method of claim 37 further comprising a mechanism to provide carrier confinement to the active region by converting the material under portion of the upper waveguide into an insulator.

42. The method of claim 37, wherein at least one of said first and second waveguides is used to guide light.

43. The microcavity structure of claim 37, wherein at least one of said first and second waveguides comprises active material used in the generation of photons.

44. The microcavity structure of claim 43, wherein said active material comprises quantum wells and/or quantum dots.

45. The microcavity structure of claim 42, wherein said first waveguide guides generated light and said second waveguide comprises active material used in the generation of photons.

46. The method of claim 45, wherein said active material comprises quantum wells and/or quantum dots.

47. The method of claim 42, wherein said second waveguide guides generated light and said first waveguide comprises active material used in the generation of photons.

48. The method of claim 47, wherein said active material comprises quantum wells and/or quantum dots.

* * * * *